(12) United States Patent
Kamineni et al.

(10) Patent No.: US 9,679,807 B1
(45) Date of Patent: Jun. 13, 2017

(54) METHOD, APPARATUS, AND SYSTEM FOR MOL INTERCONNECTS WITHOUT TITANIUM LINER

(71) Applicant: GLOBALFOUNDRIES INC., Grand Cayman (KY)

(72) Inventors: Vimal Kamineni, Albany, NY (US); Mark V. Raymond, Albany, NY (US); Praneet Adusumilli, Albany, NY (US); Chengyu Niu, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/948,214

(22) Filed: Nov. 20, 2015

(51) Int. Cl.
*H01L 21/768* (2006.01)
*H01L 23/522* (2006.01)
*H01L 29/78* (2006.01)

(52) U.S. Cl.
CPC .. *H01L 21/76843* (2013.01); *H01L 21/76802* (2013.01); *H01L 23/5226* (2013.01); *H01L 29/78* (2013.01)

(58) Field of Classification Search
CPC ......... H01L 21/76843; H01L 21/76802; H01L 23/5226; H01L 29/78
See application file for complete search history.

(56) References Cited

U.S. PATENT DOCUMENTS

| | | | |
|---|---|---|---|
| 2005/0245074 A1* | 11/2005 | Jiang | H01L 21/76808 438/637 |
| 2009/0008361 A1* | 1/2009 | Fitzsimmons | H01L 21/02063 216/19 |
| 2010/0078617 A1* | 4/2010 | Breitwisch | H01L 45/06 257/3 |
| 2010/0181682 A1* | 7/2010 | Arai | H01L 21/02126 257/774 |
| 2013/0049219 A1* | 2/2013 | Tsai | H01L 21/28518 257/774 |
| 2014/0167181 A1* | 6/2014 | Xiong | H01L 27/0629 257/379 |
| 2015/0325432 A1* | 11/2015 | Ishizaka | H01L 21/3205 438/758 |
| 2016/0093633 A1* | 3/2016 | Toba | H01L 27/11546 257/314 |

* cited by examiner

*Primary Examiner* — Christine Enad
(74) *Attorney, Agent, or Firm* — Williams Morgan, P.C.

(57) ABSTRACT

Methods, apparatus, and systems for fabricating a semiconductor device comprising a semiconductor substrate; an oxide layer above the semiconductor substrate; a first metal component comprising tungsten disposed within the oxide layer; an interlayer dielectric (ILD) above the oxide layer, wherein the ILD comprises a trench and a bottom of the trench comprises at least a portion of the top of the first metal component; a barrier material disposed on sidewalls and the bottom of the trench; and a second metal component disposed in the trench.

15 Claims, 14 Drawing Sheets

US 9,679,807 B1

METHOD, APPARATUS, AND SYSTEM FOR MOL INTERCONNECTS WITHOUT TITANIUM LINER

BACKGROUND OF THE INVENTION

Field of the Invention

Generally, the present disclosure relates to the manufacture of sophisticated semiconductor devices, and, more specifically, to various methods, structures, and systems for preparing MOL interconnects without titanium liners in semiconductor devices.

Description of the Related Art

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another. In this manner, integrated circuit chips may be fabricated.

Known for fabricating today's semiconductor devices are layers of elemental titanium disposed on a first metal component. As shown in FIG. 1 (prior art), upon deposition of a barrier material 162 and a second metal component 160 on the titanium layer, the titanium layer undergoes oxygen gettering, forming titanium oxide 152.

Unfortunately, the presence of titanium oxide 152 between the first metal component 150 and the second metal component 160 leads to a number of undesirable outcomes. For one, titanium oxide 152 increases the contact resistance to the first metal component 150/titanium oxide 152/second metal component 160 structure. For another, oxygen gettering of titanium leads to the formation of voids 166 in the second metal component 160 due to the overhang of the titanium metal. Both these outcomes impair performance of semiconductor device 100.

Therefore, it would be desirable to have a process for forming a semiconductor device comprising a first metal component and a second metal component with lower resistance and reduced void formation, relative to prior art devices, such as that shown in FIG. 1.

The present disclosure may address and/or at least reduce one or more of the problems identified above regarding the prior art and/or provide one or more of the desirable features listed above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a semiconductor device, comprising a semiconductor substrate; an oxide layer above the semiconductor substrate; a first metal component comprising tungsten disposed within the oxide layer; an interlayer dielectric (ILD) above the oxide layer, wherein the ILD comprises a trench and a bottom of the trench comprises at least a portion of the top of the first metal component; a barrier material disposed on sidewalls and the bottom of the trench; and a second metal component disposed in the trench. The present disclosure is also directed to various methods, apparatus, and systems for fabricating such a semiconductor device.

BRIEF DESCRIPTION OF THE DRAWINGS

The disclosure may be understood by reference to the following description taken in conjunction with the accompanying drawings, in which like reference numerals identify like elements, and in which.

Figure 1:
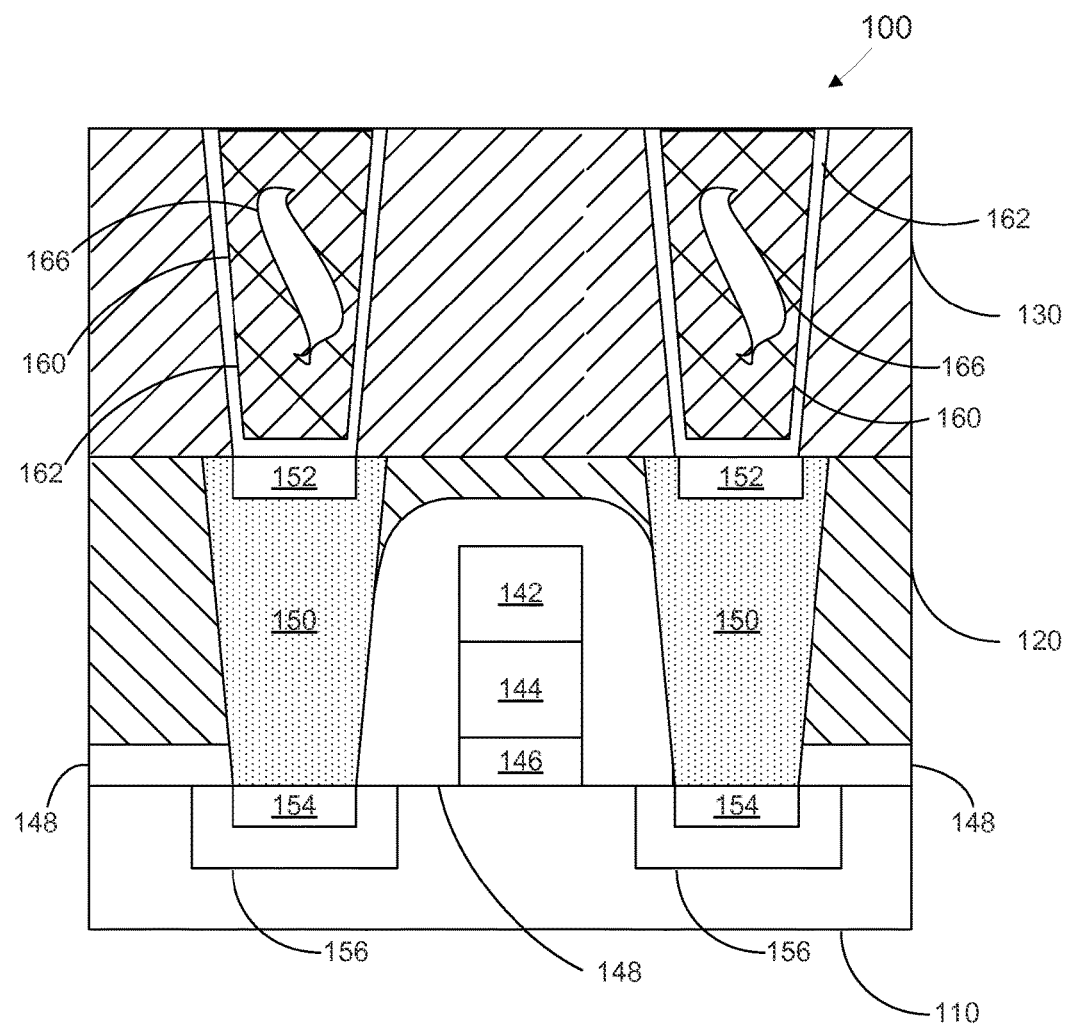
FIG. 1 illustrates a stylized cross-sectional depiction of a semiconductor device known in the prior art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for semiconductor devices fabricated without titanium layers between first and second metal components. Such devices have lower resistance and reduced voiding relative to prior art semiconductor devices fabricated with titanium between first and second metal components.

A semiconductor device in accordance with embodiments herein may comprise a semiconductor substrate; an oxide layer above the semiconductor substrate; a first metal component comprising tungsten disposed within the oxide layer; an interlayer dielectric (ILD) above the oxide layer, wherein the ILD comprises a trench and a bottom of the trench comprises at least a portion of the top of the first metal component; a barrier material disposed on sidewalls and the bottom of the trench; and a second metal component disposed in the trench.

The semiconductor substrate may comprise any material known to the person of ordinary skill in the art to be usable as a semiconductor substrate in a semiconductor device. In one embodiment, the semiconductor substrate may comprise silicon, silicon-germanium, or silicon-on-insulator (SOI), among others known in the art. The semiconductor substrate may be fabricated by any technique known to the person of ordinary skill in the art.

The oxide layer may comprise may comprise any material known to the person of ordinary skill in the art to be usable as an oxide layer in a semiconductor device. In one embodiment, the oxide layer may comprise silicon oxide. The oxide layer may be fabricated by any technique known to the person of ordinary skill in the art.

The first metal component may be any conductive component within a semiconductor device. In one embodiment, the first metal component may be a component of a gate structure of a transistor of the semiconductor device, such as an uppermost component of such a gate. In one embodiment, the gate may be formed on the semiconductor substrate. In one embodiment, the first metal component may be a contact, such as a contact with a source/drain region of a transistor of the semiconductor device, such as a source/drain region disposed in the semiconductor substrate proximate the gate. The first metal component may comprise any material known to the person of ordinary skill in the art to be conductive. In one embodiment, the first metal component may comprise tungsten. The first metal component, as well as a transistor or other structure of which the first metal component is a component, may be fabricated by any technique known to the person of ordinary skill in the art.

The ILD may comprise any material known to the person of ordinary skill in the art to be usable as an interlayer dielectric in a semiconductor device. In one embodiment, the ILD may comprise silicon nitride. The ILD may be fabricated by any technique (such as atomic layer deposition (ALD), chemical vapor deposition (CVD), physical vapor deposition (PVD), etc.) known to the person of ordinary skill in the art. Further, the trench within the ILD may be formed by any technique known to the person of ordinary skill in the art. The trench may also extend into the oxide layer, if desired. Regardless how the trench is formed, the bottom of the trench comprises at least a portion of the top of the first metal component.

The barrier material disposed on sidewalls and the bottom of the trench may comprise any material known to the person of ordinary skill in the art to be usable as a barrier material in a semiconductor device. In one embodiment, the barrier material may comprise tungsten nitride, titanium nitride, tungsten carbide, or tantalum nitride, among other barrier materials known in the art. The barrier material may be deposited on sidewalls and the bottom of the trench by any technique (ALD, CVD etc.) known to the person of ordinary skill in the art.

Similarly, to the first metal component, the second metal component may be any conductive component within a semiconductor device. In one embodiment, the second metal component may be a contact, such as a via passing vertically through the ILD. The second metal component may comprise any material known to the person of ordinary skill in the art to be conductive. The second metal component may be fabricated by any technique known to the person of ordinary skill in the art.

In one embodiment, the semiconductor device may comprise a nitride layer on the semiconductor substrate and under the oxide layer. In embodiments wherein the semiconductor device comprises a gate, the nitride layer may be disposed on the gate as well. The nitride layer may comprise any material known to the person of ordinary skill in the art to be usable in a nitride layer in a semiconductor device. In one embodiment, the nitride layer may comprise silicon and nitrogen. The nitride layer may be fabricated by any technique known to the person of ordinary skill in the art.

Figure 2A:
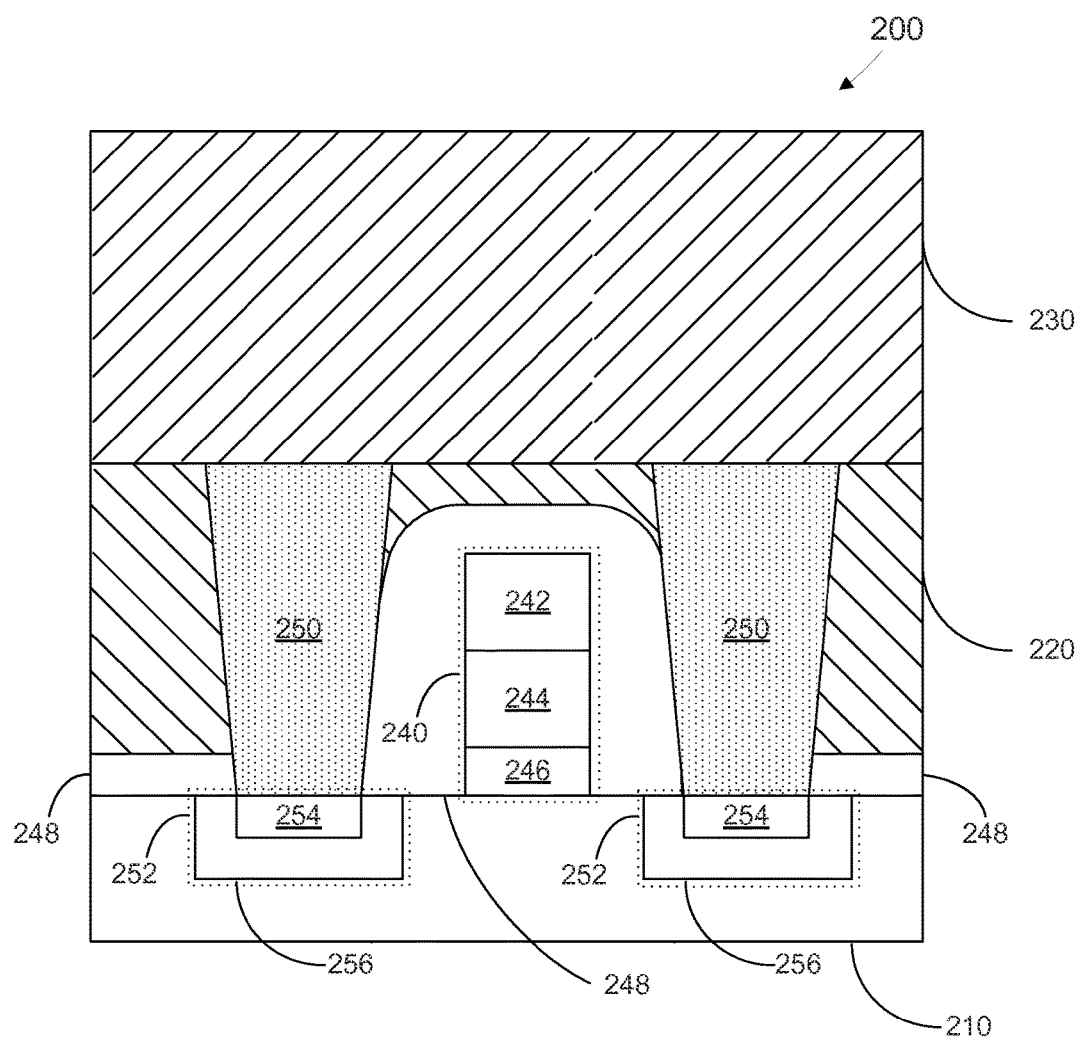
FIG. 2A illustrates a stylized cross-sectional depiction of a semiconductor device after a first stage of processing in accordance with embodiments herein.

The formation of a semiconductor device in accordance with embodiments herein is presented in FIGS. 2A-2E. Turning to FIG. 2A, a stylized depiction of a semiconductor device 200 is provided, comprising a semiconductor substrate 210, an oxide layer 220, and an ILD 230. The semiconductor device 200 also comprises a gate 240, comprising a tungsten layer 242, a WFM 244, and a high-K material 246. Proximate the gate 240 are source/drain structures 252, comprising an epitaxial silicon region 256 and a silicide region 254. Disposed on the source/drain structures 252 are first metal components 250, comprising tungsten. A nitride layer 248 is disposed over the gate 240 and substrate 210.

Figure 2B:
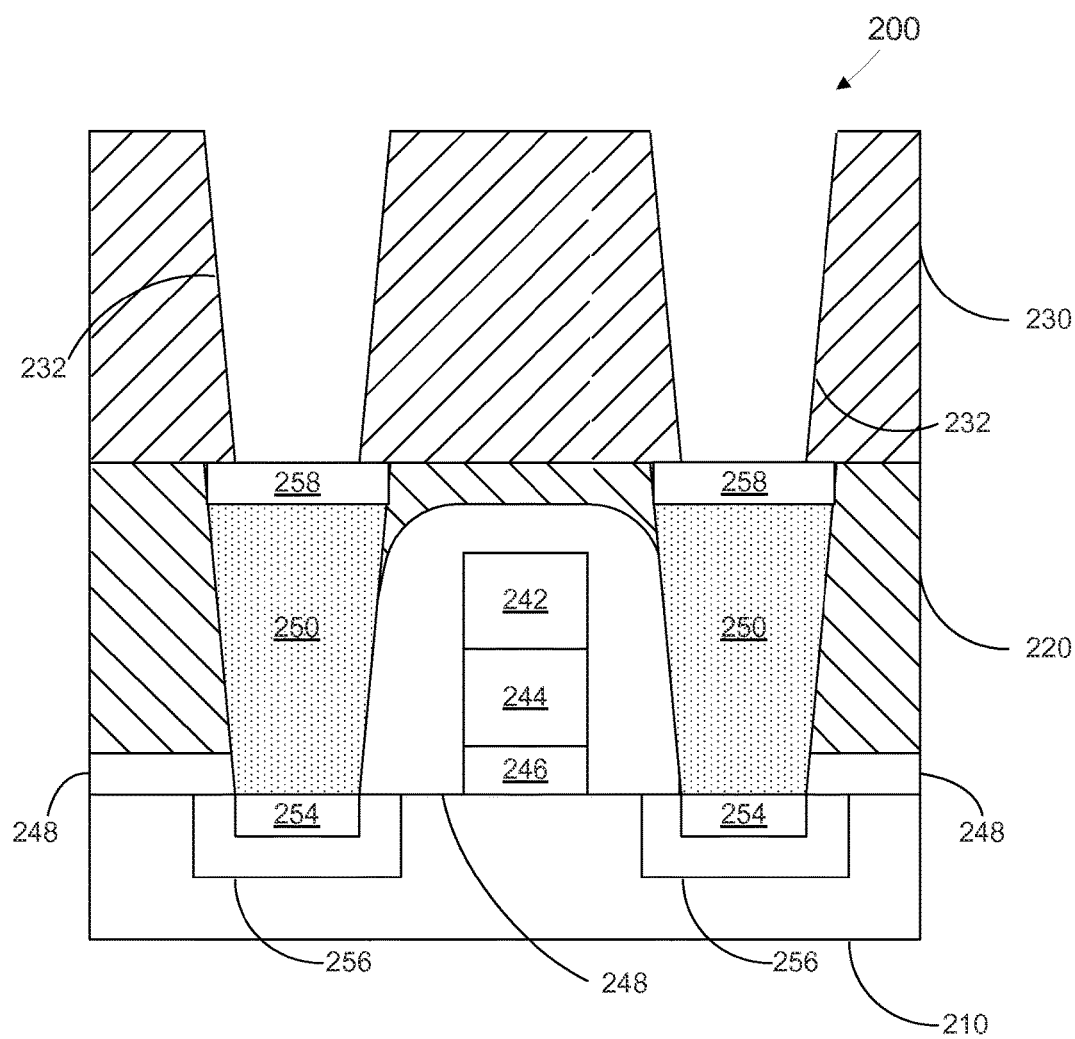
FIG. 2B illustrates a stylized cross-sectional depiction of the semiconductor device of FIG. 2A after a second stage of processing in accordance with embodiments herein.

FIG. 2B presents a stylized depiction of the semiconductor device 200 after a reactive ion etch (RIE) is performed. (For brevity, routine steps of optical lithography, patterning and masking the ILD 230 are omitted). The RIE forms trenches 232 in the ILD 230 and interacts with tungsten in the uppermost portion of first metal components 250, to form resistive tungsten-based material 258. The resistive tungsten-based material 258 forms immediately after the first contact 250 is exposed to air, whereby tungsten reacts with the oxygen in air and forms tungsten oxide (WOx). More WOx and other resistive tungsten compounds may form in the reissitve tungsten-based material 258 by interactions between tungsten and the RIE chemistries, which may include one or more of oxygen-, nitrogen-, fluorine-, and carbon-based gases. Furthermore, after RIE, if the device is exposed to air or other oxygenated ambient before subsequent processing steps, more tungsten oxide and other resistive tungsten compounds, which may include compounds of tungsten with carbon, fluorine, etc., may form.

Figure 2C:
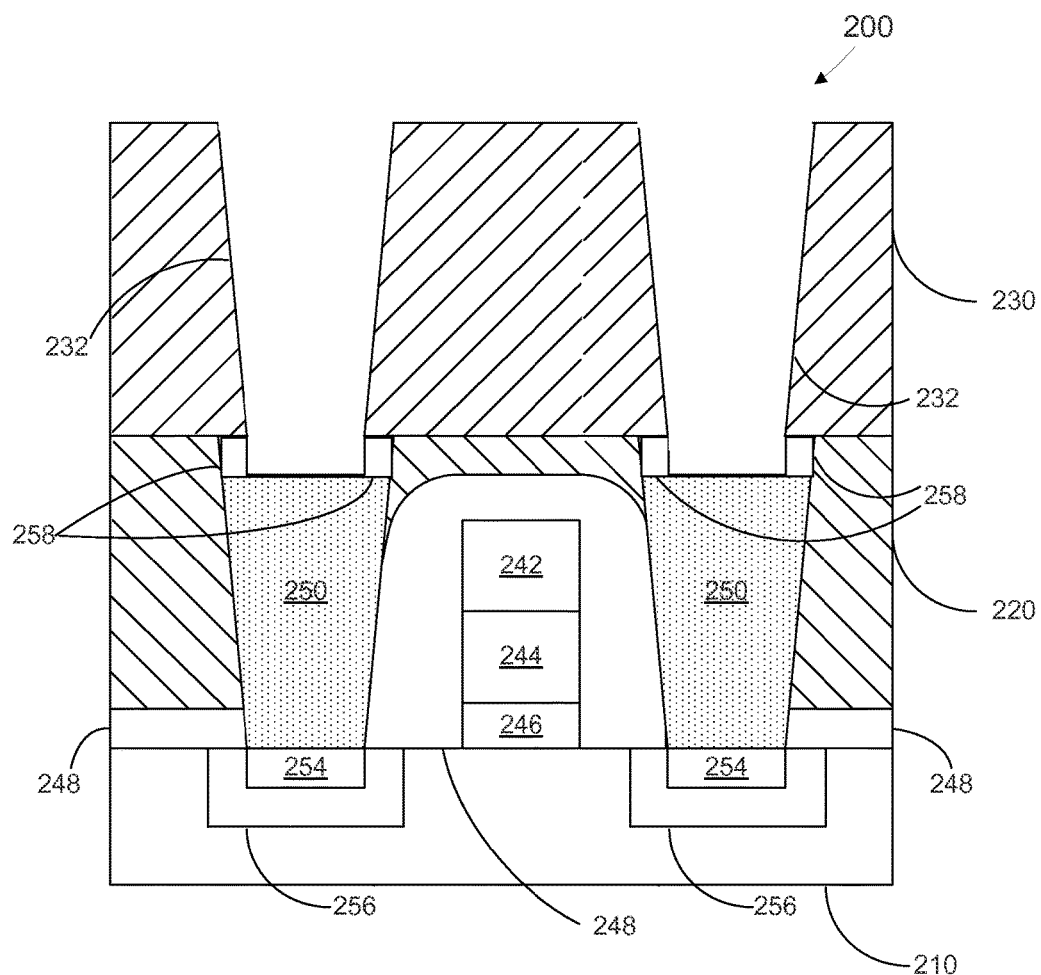
FIG. 2C illustrates a stylized cross-sectional depiction of the semiconductor device of FIGS. 2A-2B after a third stage of processing in accordance with embodiments herein.

FIG. 2C presents a stylized depiction of the semiconductor device 200 after a chemical etch is performed. The chemical etch is selective to ILD 230 and removes at least some resistive tungsten-based material 258, thereby exposing first metal components 250. In one embodiment, the chemical etch comprises an $NF_3$ plasma.

Figure 2D:
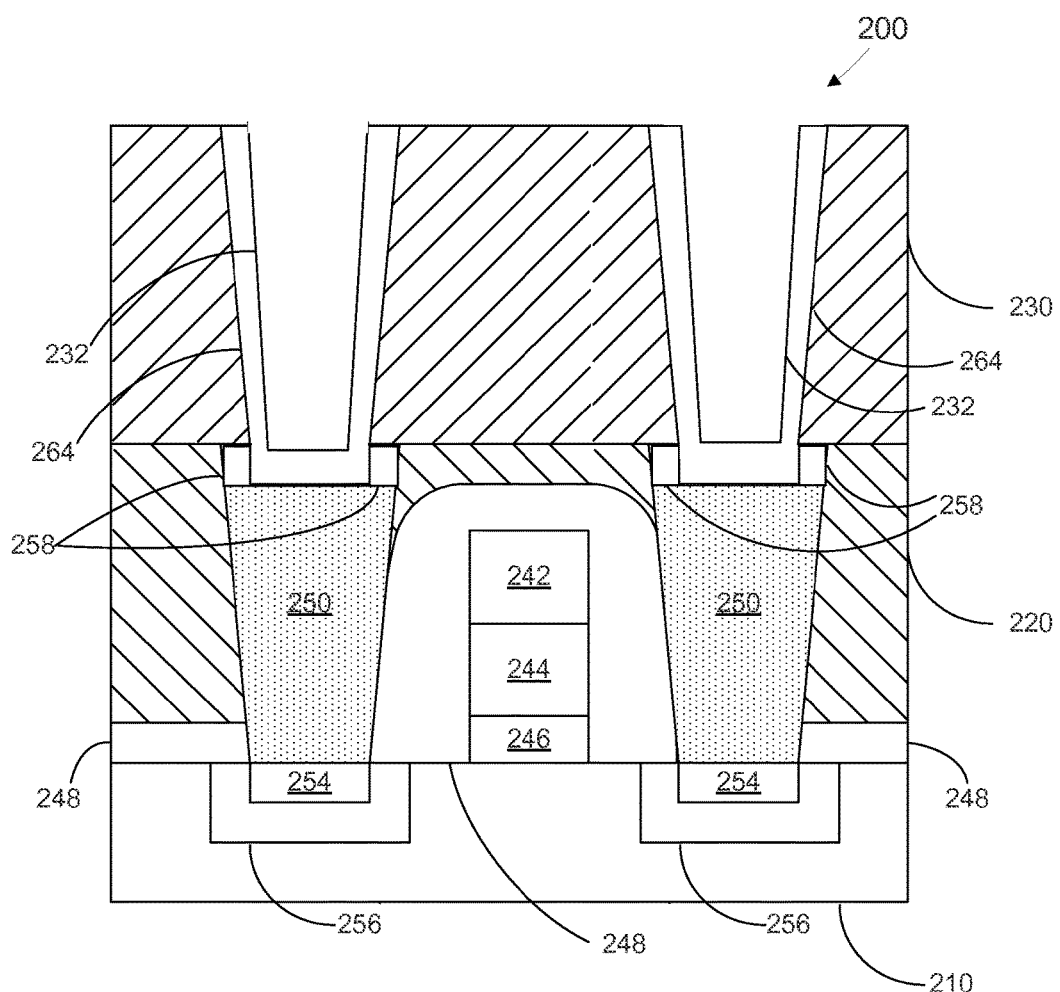
FIG. 2D illustrates a stylized cross-sectional depiction of the semiconductor device of FIGS. 2A-2C after a fourth stage of processing in accordance with embodiments herein.

FIG. 2D presents a stylized depiction of the semiconductor device 200 after a barrier material 264 has been deposited on the sidewalls and bottoms of trenches 232 after the chemical etch in-situ. Desirably, no air break is permitted between the chemical etch and the barrier deposition; in other words, depositing the barrier material is desirably performed such that air or oxygenated ambient does not contact the top surface of the first metal component after performing the chemical etch selective to the ILD. The barrier material 264 is in contact with first metal components 250.

Figure 2E:
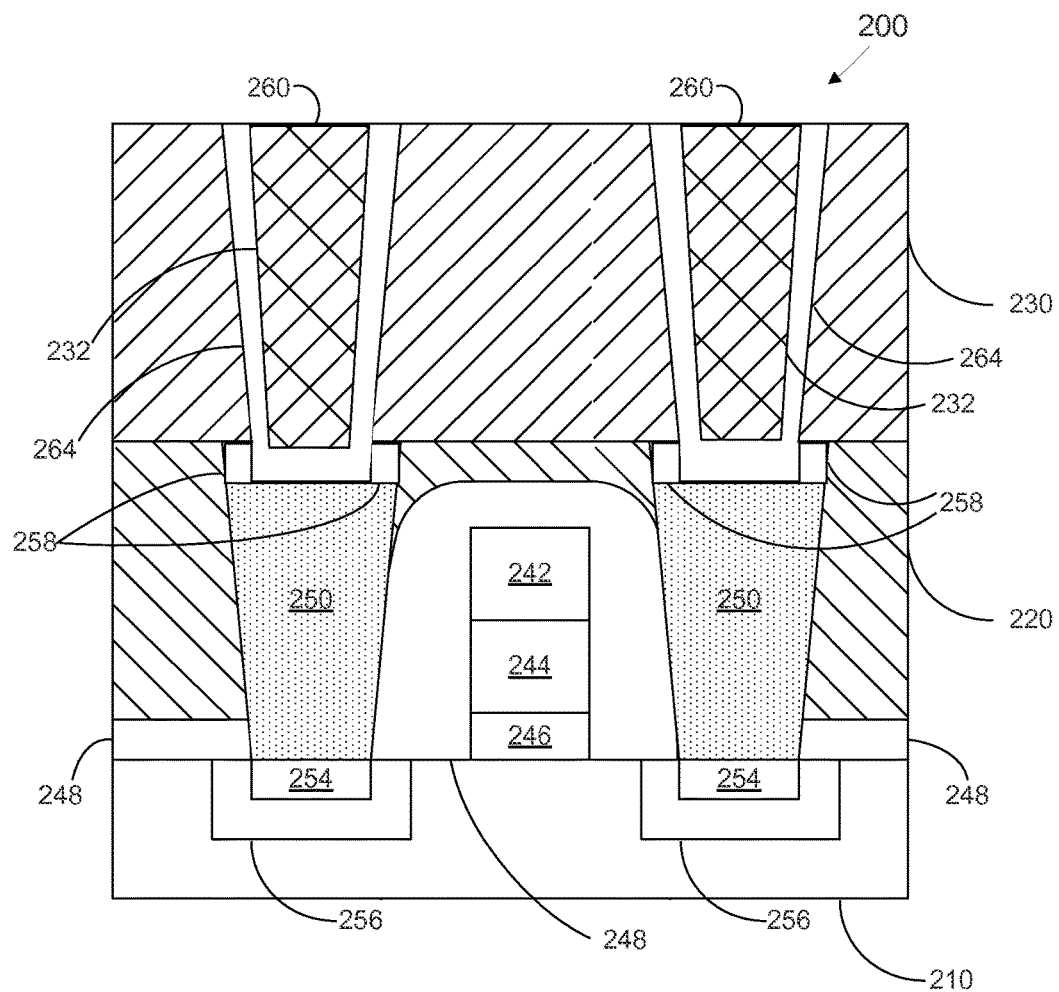
FIG. 2E illustrates a stylized cross-sectional depiction of the semiconductor device of FIGS. 2A-2D after a fifth stage of processing in accordance with embodiments herein.

FIG. 2E presents a stylized depiction of the semiconductor device 200 after second metal component 260 has been deposited in trenches 232. The second metal component 260 may undergo planarization relative to the top of the ILD 230, if desired. The second metal component 260 is generally free of voids, relative to the metal component 160 of prior art semiconductor device 100 shown in FIG. 1.

Figure 3A:
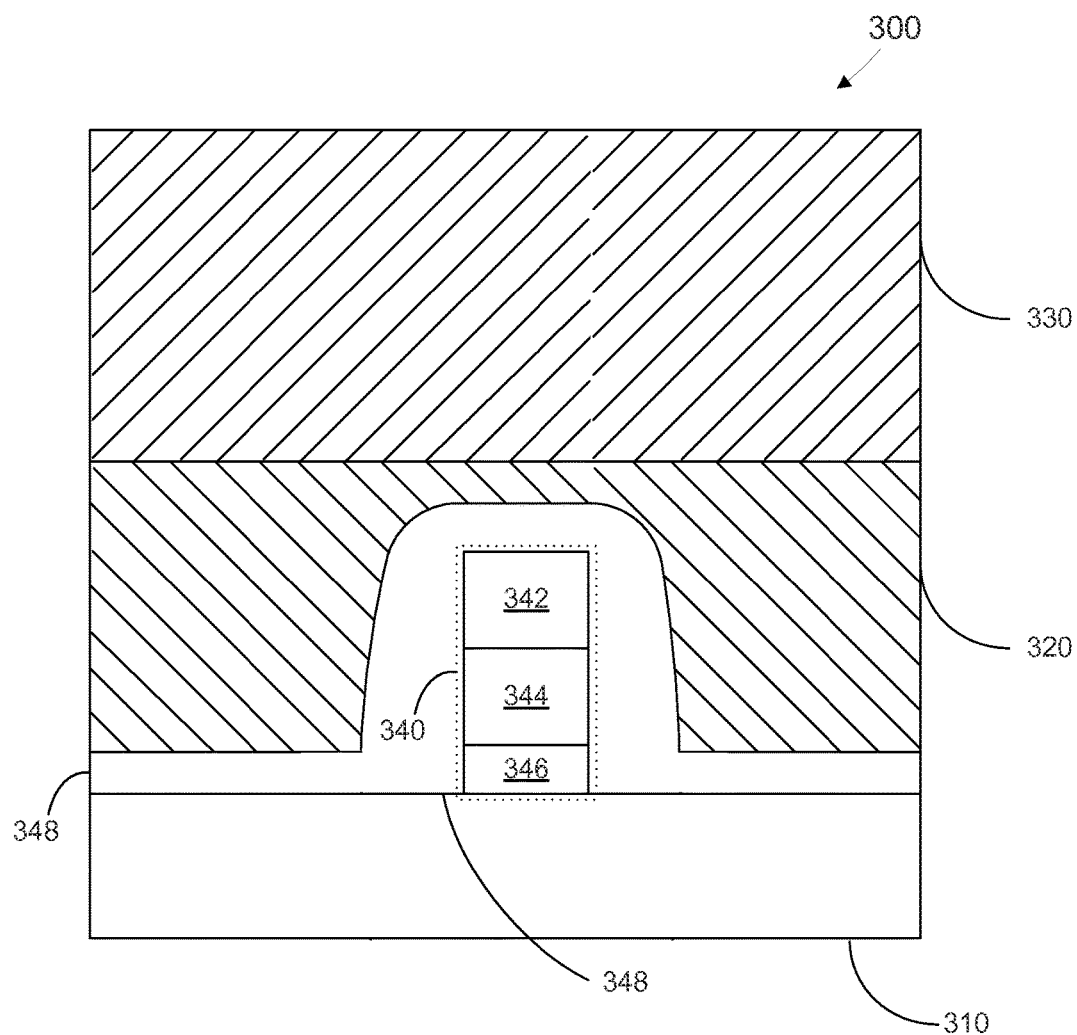
FIG. 3A illustrates a stylized cross-sectional depiction of a semiconductor device after a first stage of processing in accordance with embodiments herein.

The formation of another semiconductor device in accordance with embodiments herein is presented in FIGS. 3A-3E. Turning to FIG. 3A, a stylized depiction of a semiconductor device 300 is provided, comprising a semiconductor substrate 310, an oxide layer 320, and an ILD 330. The semiconductor device 300 also comprises a gate 340, comprising a tungsten layer 342, a WFM 344, and a high-K material 346. The semiconductor device 300 may also comprise source/drain structures (omitted for brevity) proximate the gate 340. A nitride layer 348 is disposed over the gate 340 and substrate 310.

Figure 3B:
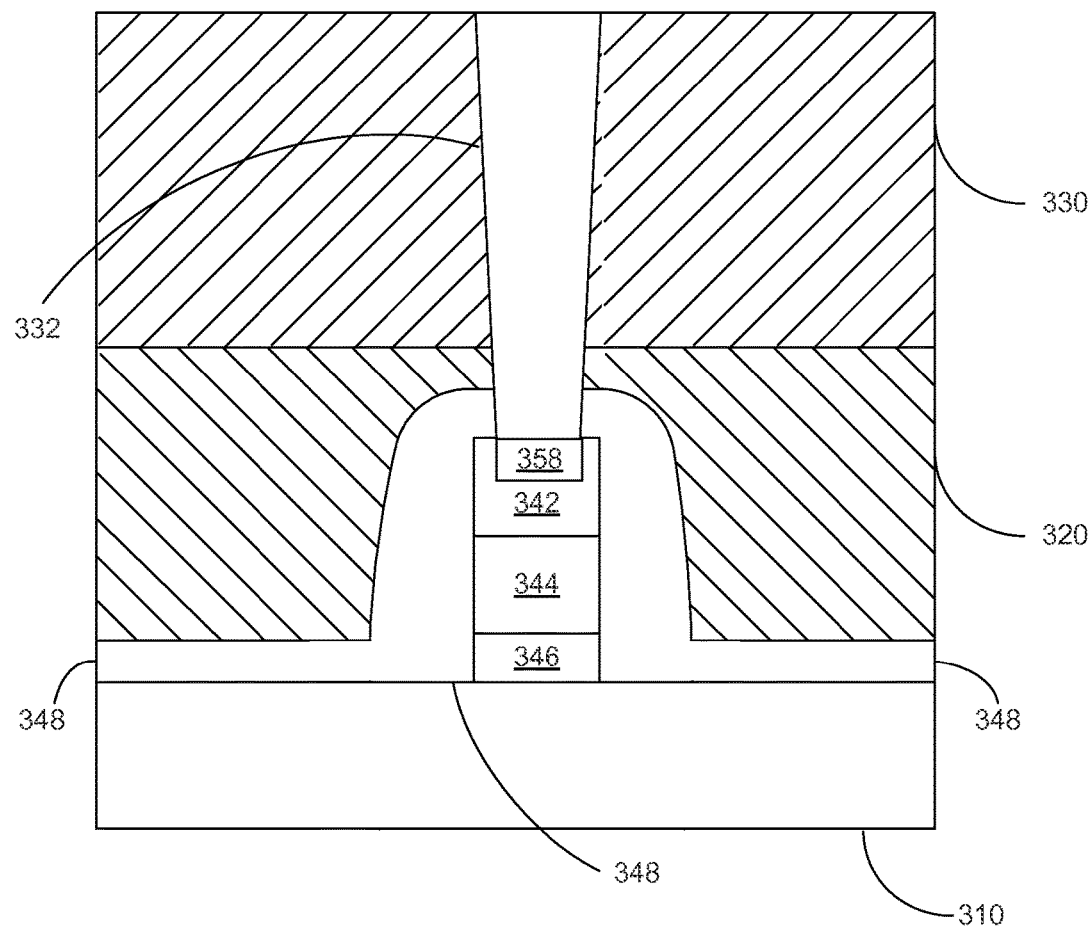
FIG. 3B illustrates a stylized cross-sectional depiction of the semiconductor device of FIG. 3A after a second stage of processing in accordance with embodiments herein.

FIG. 3B presents a stylized depiction of the semiconductor device 300 after a reactive ion etch (RIE) is performed. The RIE forms trenches 332 in the ILD 330, oxide layer 320, and nitride layer 348, and interacts with tungsten in the uppermost portion of tungsten layer 342, to form resistive tungsten-based material 358. The formation mechanisms of resistive tungsten-based material 358 and the types of tungsten compounds typically found in the resistive tungsten-based material 358 are as discussed above regarding resistive tungsten-based material 258 in the context of FIGS. 2A-2E.

Figure 3C:
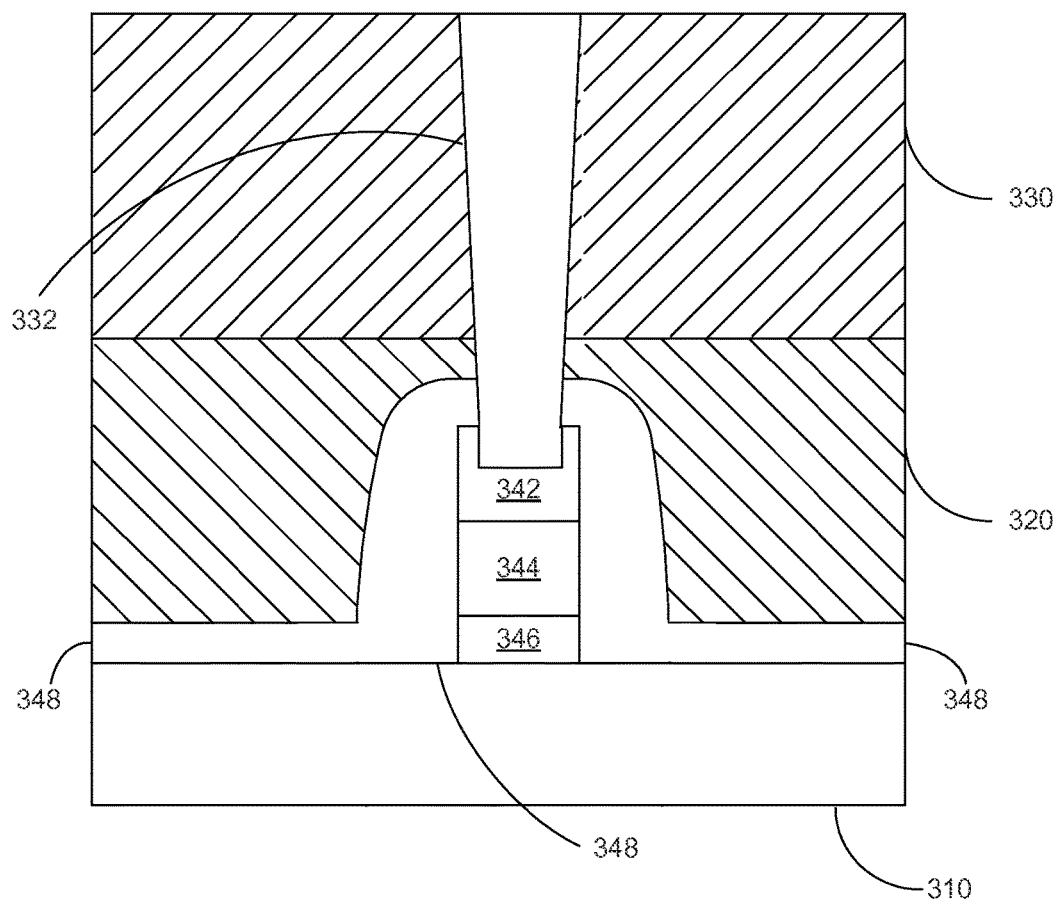
FIG. 3C illustrates a stylized cross-sectional depiction of the semiconductor device of FIGS. 3A-3B after a third stage of processing in accordance with embodiments herein.

FIG. 3C presents a stylized depiction of the semiconductor device 300 after a chemical etch is performed. The chemical etch is selective to ILD 330, oxide layer 320, and nitride layer 348, and removes at least some resistive tungsten-based material 358, thereby exposing tungsten layer 342. In one embodiment, the chemical etch comprises an $NF_3$ plasma.

Figure 3D:
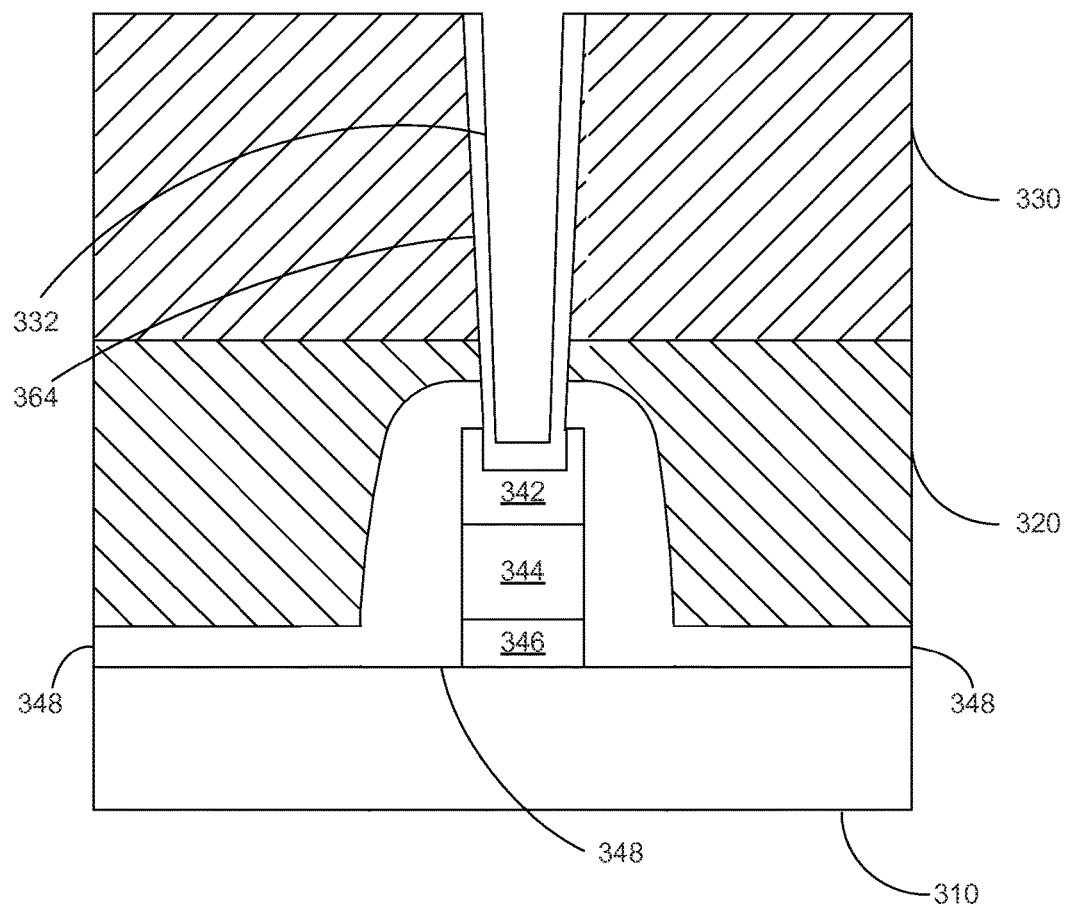
FIG. 3D illustrates a stylized cross-sectional depiction of the semiconductor device of FIGS. 3A-3C after a fourth stage of processing in accordance with embodiments herein.

FIG. 3D presents a stylized depiction of the semiconductor device 300 after a barrier material 364 has been deposited on the sidewalls and bottoms of trench 332. Desirably, no air break is permitted between the chemical etch and the barrier deposition. The barrier material 364 is in contact with tungsten layer 342.

Figure 3E:
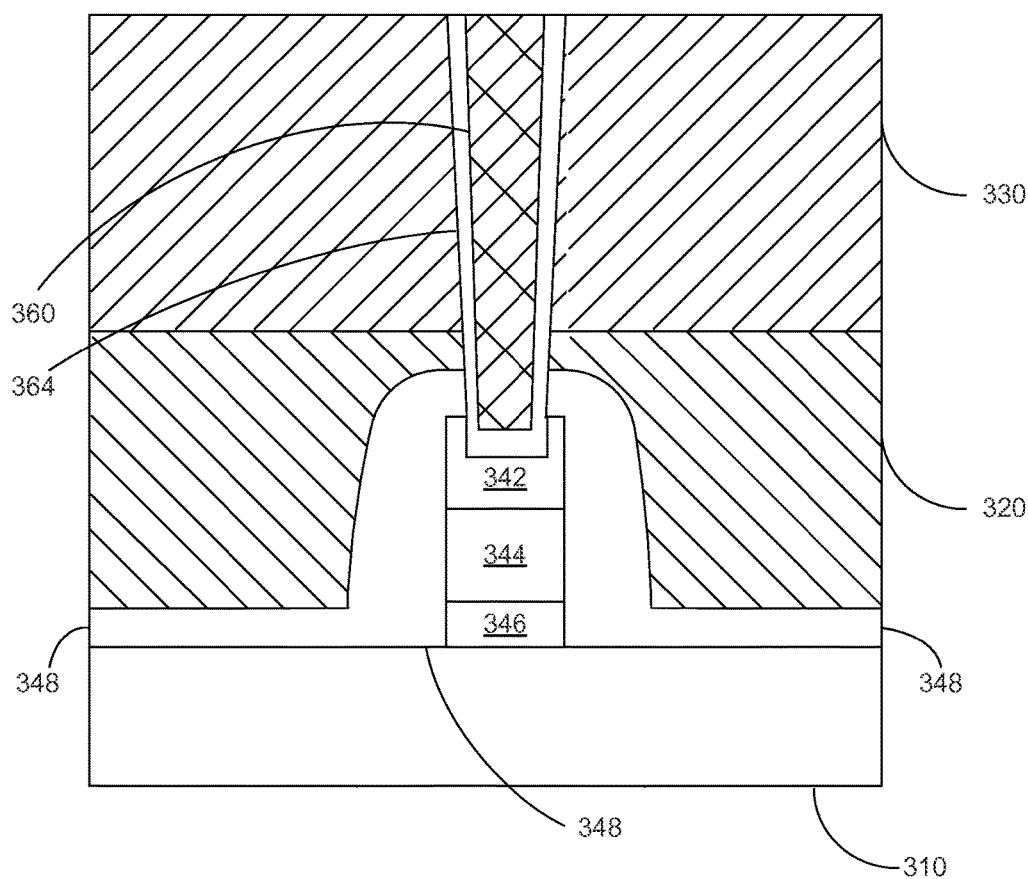
FIG. 3E illustrates a stylized cross-sectional depiction of the semiconductor device of FIGS. 3A-3D after a fifth stage of processing in accordance with embodiments herein.

FIG. 3E presents a stylized depiction of the semiconductor device 300 after second metal component 360 has been deposited in trenches 332 and polished via chemical mechanical planarization. The second metal component 360 is generally free of voids, relative to the metal component 160 of prior art semiconductor device 100 shown in FIG. 1.

Figure 4:
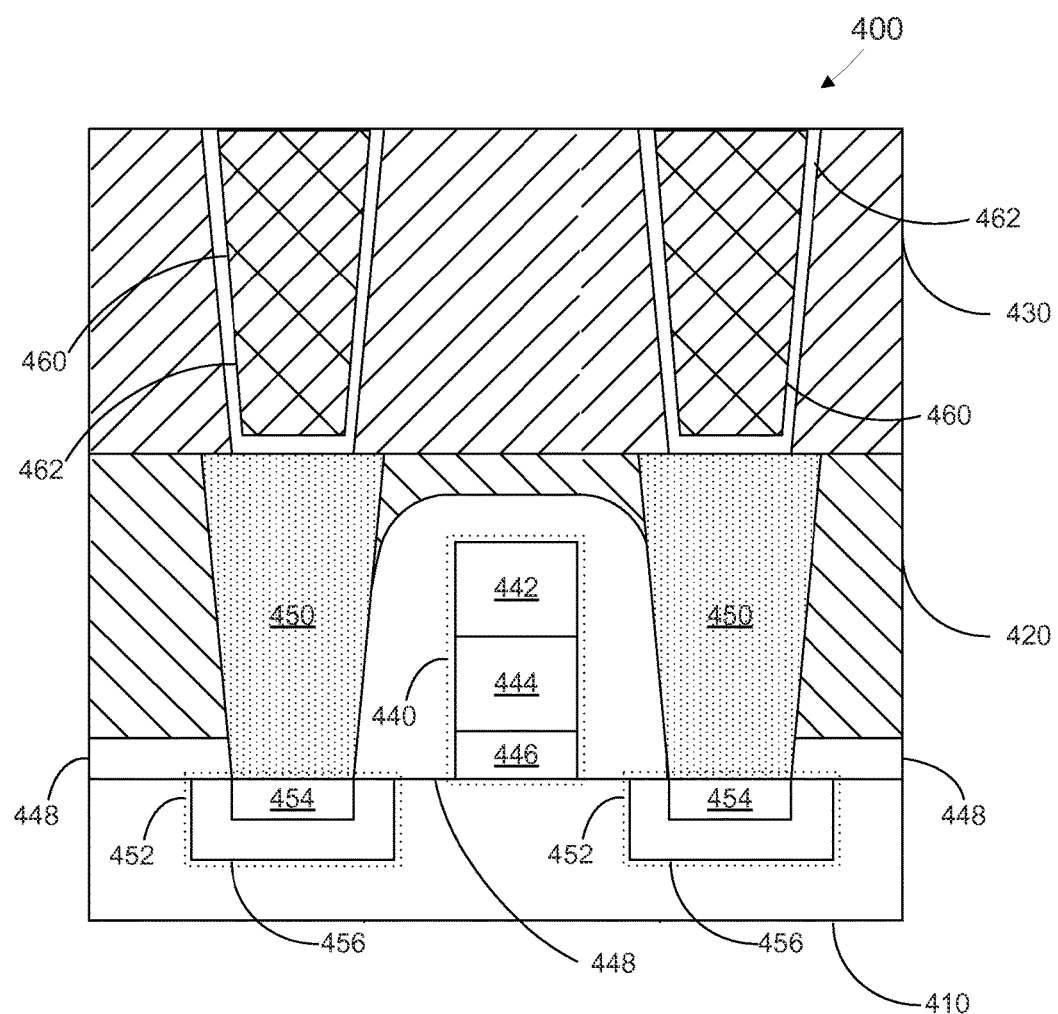
FIG. 4 illustrates a stylized cross-sectional depiction of a semiconductor device in accordance with embodiments herein.

FIG. 4 presents a stylized depiction of a semiconductor device 400 in accordance with embodiments herein. The semiconductor device 400 comprises a semiconductor substrate 410, an oxide layer 220, a nitride layer 448, and an ILD 430. The semiconductor device 400 also comprises a gate 440, comprising a tungsten layer 442, a WFM 444, and a high-K material 446. Proximate the gate 440 are source/drain structures 452, comprising an epitaxial silicon region 456 and a silicide region 454. Disposed on the source/drain structures 452 are first metal components 450, comprising tungsten. Disposed within the ILD 430 are barrier material 462 and second metal component 460. Second metal component 460 is free of voids, relative to the metal component 160 of prior art semiconductor device 100 shown in FIG. 1. Also, in a 7 nm fabrication process, resistance through structures 450, 462, and 460 is about 10% less than resistance through structures 150, 152, 162, and 160 of the prior art semiconductor device shown in FIG. 1.

Figure 5:
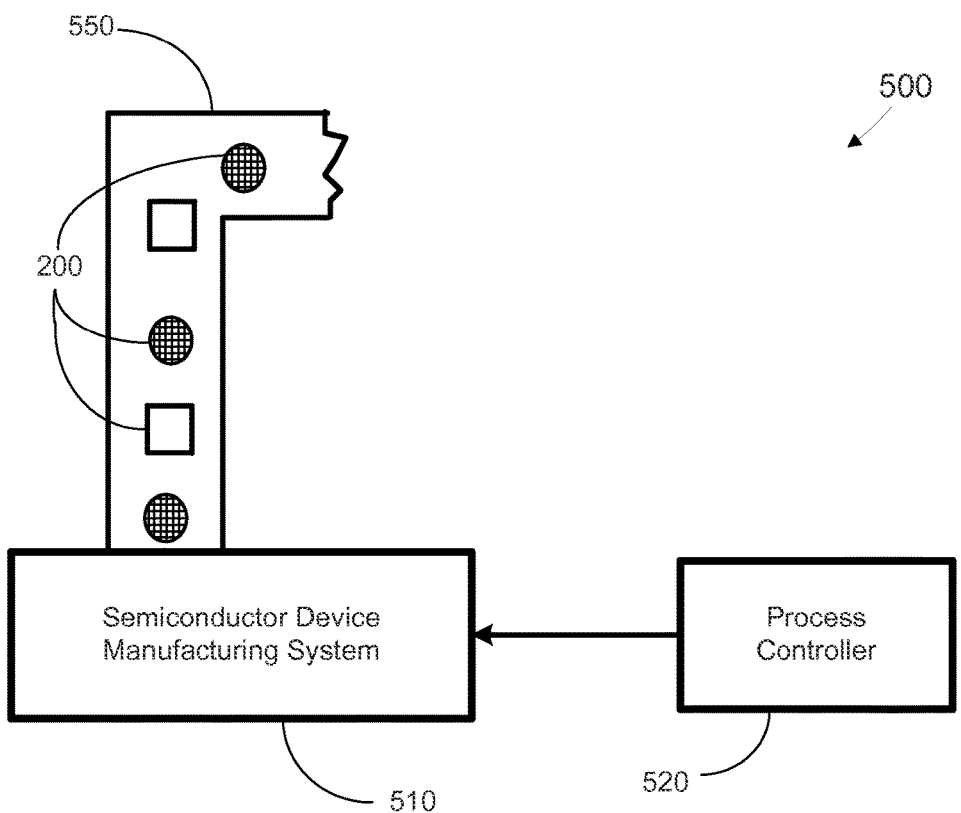
FIG. 5 illustrates a semiconductor device manufacturing system for manufacturing a device in accordance with embodiments herein.

Turning now to FIG. 5, a stylized depiction of a system for fabricating a semiconductor device 100, in accordance with embodiments herein, is illustrated. The system 500 of FIG. 5 may comprise a semiconductor device manufacturing system 510 and a process controller 520. The semiconductor device manufacturing system 510 may manufacture semiconductor devices based upon one or more instruction sets provided by the process controller 520. In one embodiment, wherein the instruction set may comprise instructions wherein the instruction set comprises instructions to provide a device stack comprising a semiconductor substrate; an oxide layer above the semiconductor substrate; an interlayer dielectric (ILD) above the oxide layer; a first metal component comprising tungsten disposed within the oxide layer; perform a reactive ion etch to form at least one trench in at least the ILD, whereby at least a portion of a top surface of the first metal component is converted to resistive tungsten-based material; perform a chemical etch selective to the ILD to remove at least a portion of the resistive tungsten-based material and expose at least a portion of the top surface of the first metal component; deposit a barrier material on sidewalls and the bottom of the trench; and deposit a second metal in the trench.

The device stack may further comprise a gate on the semiconductor substrate and a source/drain region disposed in the semiconductor substrate proximate the gate, and the first metal component is on the source/drain region. Alternatively or in addition, the device stack may further comprise a gate on the semiconductor substrate, wherein the first metal component is an uppermost metal layer of the gate. In any embodiment, the device stack may further comprise a nitride layer on the semiconductor substrate, under the oxide layer, and on the gate, if any.

In one embodiment, the semiconductor device manufacturing system 510 may be configured to perform the chemical etch by performing a plasma $NF_3$ etch. The semiconductor device manufacturing system 510 may also be configured to planarize the second metal.

The semiconductor device manufacturing system 510 may comprise various processing stations, such as etch process stations, photolithography process stations, CMP process stations, etc. One or more of the processing steps performed by the semiconductor device manufacturing system 510 may be controlled by the process controller 520. The process controller 520 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device manufacturing system 510 may produce semiconductor devices 200 (e.g., integrated circuits) on a medium, such as silicon wafers. The semiconductor device manufacturing system 510 may provide processed semiconductor devices 200 on a transport mechanism 550, such as a conveyor system. In some embodiments, the conveyor system may be sophisticated clean room transport systems that are capable of transporting semiconductor wafers. In one embodiment, the semiconductor device manufacturing system 510 may comprise a plurality of processing steps, e.g., the $1^{st}$ process step, the $2^{nd}$ process step, etc.

In some embodiments, the items labeled "200" may represent individual wafers, and in other embodiments, the items 200 may represent a group of semiconductor wafers, e.g., a "lot" of semiconductor wafers. The semiconductor device 200 may comprise one or more of a transistor, a capacitor, a resistor, a memory cell, a processor, and/or the like. In one embodiment, the semiconductor device 200 comprises a middle of line (MOL) stack.

The system 500 may be capable of manufacturing various products involving various technologies. For example, the system 500 may produce devices of CMOS technology, Flash technology, BiCMOS technology, power devices, memory devices (e.g., DRAM devices), NAND memory devices, and/or various other semiconductor technologies.

Figure 6:
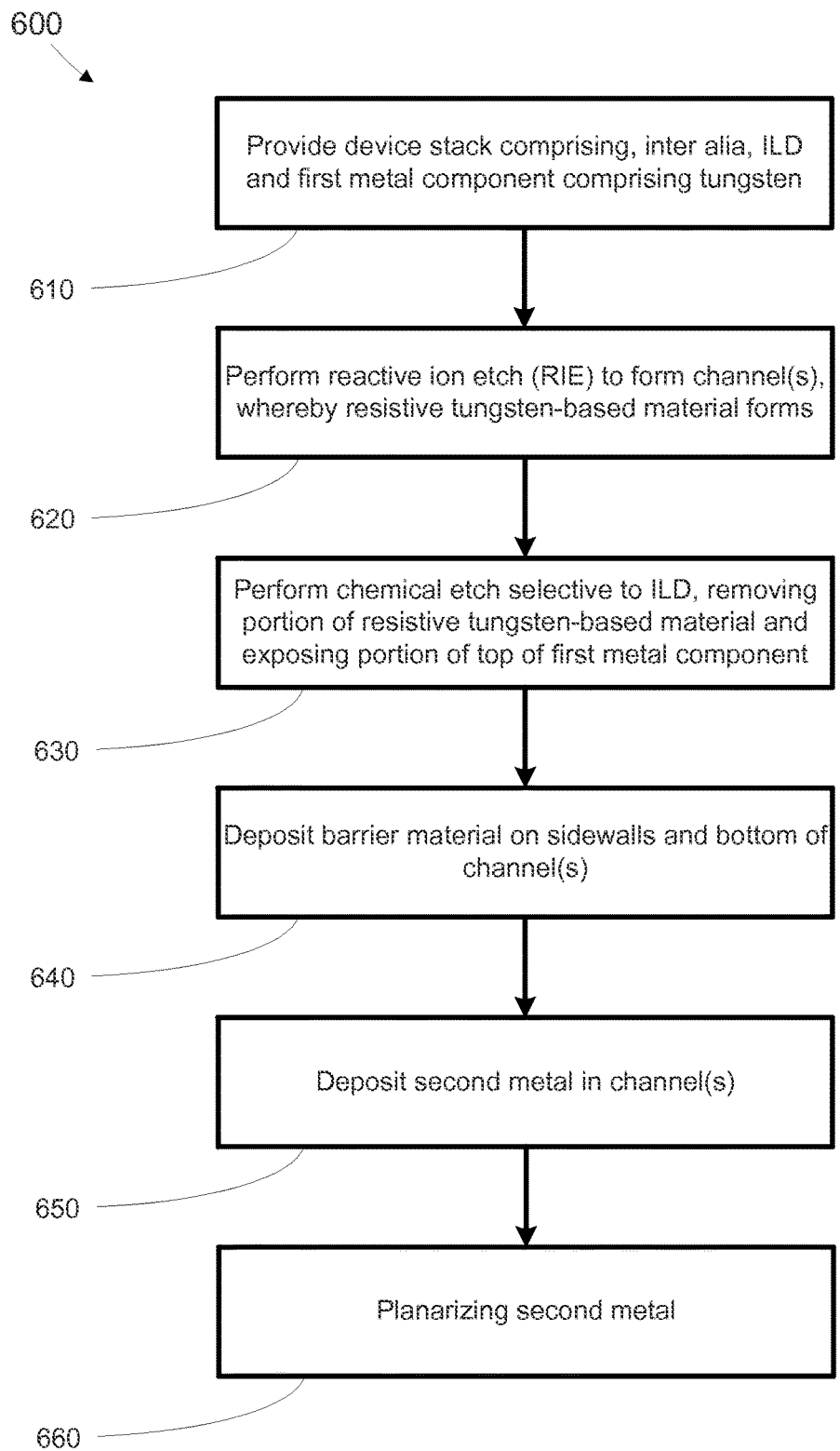
FIG. 6 illustrates a flowchart of a method in accordance with embodiments herein.

Turning to FIG. 6, a flowchart of a method 600 in accordance with embodiments herein is depicted. The method 600 comprises providing (at 610) a device stack comprising a semiconductor substrate; an oxide layer above the semiconductor substrate; an interlayer dielectric (ILD) above the oxide layer; and a first metal component comprising tungsten disposed within the oxide layer.

In one embodiment, the device stack further comprises a gate on the semiconductor substrate and a source/drain region disposed in the semiconductor substrate proximate the gate, and the first metal component is on the source/drain region. The device stack may further comprise a nitride layer on the semiconductor substrate, on the gate, and under the oxide layer.

In one embodiment, the device stack further comprises a gate on the semiconductor substrate, and the first metal component is an uppermost metal layer of the gate. The device stack may further comprise further comprises a nitride layer on the semiconductor substrate, on the gate, and under the oxide layer.

The method 600 also comprises performing (at 620) a reactive ion etch to form at least one trench in at least the ILD, whereby at least a portion of a top surface of the first metal component is converted to resistive tungsten-based material. The method 600 also comprises performing (at 630) a chemical etch selective to the ILD to remove at least a portion of the resistive tungsten-based material and expose at least a portion of the top surface of the first metal component. In one embodiment, the chemical etch comprises a plasma $NF_3$ etch.

The method 600 also comprises depositing (at 640) a barrier material on sidewalls and the bottom of the trench. The method 600 also comprises depositing (at 650) a second metal in the trench.

In one embodiment, the method 600 may further comprise planarizing (at 660) the second metal.

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method, comprising:
   providing a device stack comprising a semiconductor substrate; an oxide layer above the semiconductor substrate; an interlayer dielectric (ILD) above the oxide layer; and a first metal component comprising tungsten disposed within the oxide layer;
   performing a reactive ion etch to form at least one trench in at least the ILD, whereby at least a portion of a top surface of the first metal component is converted to resistive tungsten-based material;

performing a chemical etch selective to the ILD to remove at least a portion of the resistive tungsten-based material and expose at least a portion of the top surface of the first metal component;

depositing a barrier material on sidewalls and the bottom of the trench; and depositing a second metal in the trench.

2. The method of claim 1, wherein the device stack further comprises a gate on the semiconductor substrate and a source/drain region disposed in the semiconductor substrate proximate the gate, and the first metal component is on the source/drain region.

3. The method of claim 2, wherein the device stack further comprises a nitride layer on the semiconductor substrate, on the gate, and under the oxide layer.

4. The method of claim 2, wherein depositing the barrier material is performed such that air or oxygenated ambient does not contact the top surface of the first metal component after performing the chemical etch selective to the ILD.

5. The method of claim 1, wherein the device stack further comprises a gate on the semiconductor substrate, and the first metal component is an uppermost metal layer of the gate.

6. The method of claim 5, wherein the device stack further comprises a nitride layer on the semiconductor substrate, on the gate, and under the oxide layer.

7. The method of claim 1, wherein the chemical etch comprises a plasma $NF_3$ etch.

8. The method of claim 1, further comprising planarizing the second metal.

9. A system, comprising:

a process controller, configured to provide an instruction set for manufacture of the semiconductor device to a manufacturing system; and the manufacturing system, configured to manufacture the semiconductor device according to the instruction set;

wherein the instruction set comprises instructions to:

provide a device stack comprising a semiconductor substrate; an oxide layer above the semiconductor substrate; an interlayer dielectric (ILD) above the oxide layer; and a first metal component comprising tungsten disposed within the oxide layer;

perform a reactive ion etch to form at least one trench in at least the ILD, whereby at least a portion of a top surface of the first metal component is converted to resistive tungsten-based material;

perform a chemical etch selective to the ILD to remove at least a portion of the resistive tungsten-based material and expose at least a portion of the top surface of the first metal component;

deposit a barrier material on sidewalls and the bottom of the trench; and deposit a second metal in the trench.

10. The system of claim 9, wherein the device stack further comprises a gate on the semiconductor substrate and a source/drain region disposed in the semiconductor substrate proximate the gate, and the first metal component is on the source/drain region.

11. The system of claim 10, wherein the device stack further comprises a nitride layer on the semiconductor substrate, on the gate, and under the oxide layer.

12. The system of claim 9, wherein the device stack further comprises a gate on the semiconductor substrate, and the first metal component is an uppermost metal layer of the gate.

13. The system of claim 12, wherein the device stack further comprises a nitride layer on the semiconductor substrate, on the gate, and under the oxide layer.

14. The system of claim 9, wherein the chemical etch comprises a plasma $NF_3$ etch.

15. The system of claim 9, further comprising instructions to planarize the second metal.

* * * * *